(12) United States Patent
Reza et al.

(10) Patent No.: US 8,339,790 B2
(45) Date of Patent: Dec. 25, 2012

(54) MONOLITHIC MICROWAVE INTEGRATED CIRCUIT

(75) Inventors: Shahed Reza, Boxborough, MA (US);
Edward Swiderski, Chester, NH (US);
Roberto W. Alm, Windham, NH (US)

(73) Assignee: Raytheon Company, Waltham, MA (US)

( * ) Notice: Subject to any disclaimer, the term of this patent is extended or adjusted under 35 U.S.C. 154(b) by 60 days.

(21) Appl. No.: 12/879,044

(22) Filed: Sep. 10, 2010

(65) Prior Publication Data
US 2012/0063097 A1 Mar. 15, 2012

(51) Int. Cl.
*H05K 7/20* (2006.01)
(52) U.S. Cl. ........ 361/719; 361/709; 361/717; 361/720; 361/764; 438/122; 438/129; 333/204; 333/247; 333/250
(58) Field of Classification Search .......... 361/704–722, 361/760, 763–764
See application file for complete search history.

(56) References Cited

U.S. PATENT DOCUMENTS

| | | | | |
|---|---|---|---|---|
| 5,049,978 | A * | 9/1991 | Bates et al. ................. | 257/686 |
| 5,614,442 | A * | 3/1997 | Tserng ........................ | 438/122 |
| 5,760,650 | A | 6/1998 | Faulkner et al. | |
| RE35,869 | E | 8/1998 | Mohwinkel | |
| 6,137,125 | A * | 10/2000 | Costas et al. ................ | 257/275 |
| 6,282,095 | B1 * | 8/2001 | Houghton et al. ........... | 361/704 |
| 6,331,807 | B1 | 12/2001 | Prieto et al. | |
| 6,455,880 | B1 | 9/2002 | Ono et al. | |
| 6,967,282 | B2 | 11/2005 | Tonomura et al. | |
| 7,864,532 | B1 * | 1/2011 | Ehret et al. .................. | 361/713 |
| 7,898,810 | B2 * | 3/2011 | Mason et al. ................ | 361/717 |
| 7,940,524 | B2 * | 5/2011 | Rummel et al. ............. | 361/689 |
| 2005/0224946 | A1 * | 10/2005 | Dutta ........................... | 257/686 |
| 2009/0250808 | A1 | 10/2009 | Lewis et al. | |

FOREIGN PATENT DOCUMENTS

| | | |
|---|---|---|
| EP | 0 592 002 A2 | 4/1994 |
| EP | 0 592 002 A3 | 4/1994 |
| EP | 1 030 368 A1 | 8/2000 |
| EP | 1 942 524 A2 | 7/2008 |
| EP | 1 942 524 A3 | 7/2008 |

OTHER PUBLICATIONS

Notification of Transmittal of the International Search Report and the Written Opinion of the International Searching Authority, or the Declaration dated Nov. 23, 2011, PCT/US2011/049039.
Written Opinion of the International Searching Authority dated Nov. 23, 2011, PCT/US2011/049039.
Kobayashi et al.; "A 50 MHz-30 GHz Broadband Co-Planar Waveguide SPDT PIN Diode Switch with 45-dB Isolation", IEEE Xplore, vol. 5, No. 2, Feb. 1995, pp. 56-58.
Sequeira et al.; "Monolithic GaAs W-Band Pseudomorphic Modfet Amplifiers", GaAs IC Symposium—161, IEEE Xplore, Apr. 1990, 4 pages.

(Continued)

*Primary Examiner* — Courtney Smith
(74) *Attorney, Agent, or Firm* — Daly, Crowley, Mofford & Durkee, LLP

(57) ABSTRACT

A monolithic microwave integrated circuit structure having a semiconductor substrate structure with a plurality of active devices and a microwave transmission line having an input section, an output section and a interconnecting section electrically interconnecting the active devices on one surface and a metal layer on an opposite surface overlaying the interconnection section and absent from overlaying at least one of the input section and the output section.

12 Claims, 6 Drawing Sheets

OTHER PUBLICATIONS

Golja et al.; "A Coplanar-to-Microstrip Transition for W-Band Circuit Fabrication with 100-μm-Thick GaAs Wafers", IEEE Xplore, vol. 3, No. 2, Feb. 1993, pp. 29-31.
Radisic et al.; A High-Performance 85-119 GHz GCPW MMIC Low Noise Amplifier, HRL Laboratiries, LLC, Malibu, CA, Jet Propulsion Laboratory, Pasadena, CA. 2000 IEEE Radio Frequency Integrated Circuits Symposium; 0-7803-6280, Feb. 2000, pp. 43-46.
Micovic et al.; "Ka-band MMIC Power Amplifier in FaN HFET Technology", HRL Laboratories LLC, 3011 Malibu Canyon Road, Malibu, CA, USA. 2004 IEEE MTT-S Digest, 0-7803-8331, Jan. 2004, pp. 1653-1656.
Reza et al.; "Waveguide Modes in CPW MMICs: Analysis and Solution", Jan. 19, 2010, 6 pages.

* cited by examiner

MONOLITHIC MICROWAVE INTEGRATED CIRCUIT

TECHNICAL FIELD

This disclosure relates generally to monolithic microwave integrated circuits (MMICs) and more particularly to MMICs having heat sinks.

BACKGROUND AND SUMMARY

As is known in the art, monolithic microwave integrated circuits (MMICs) have a wide range of applications. Typically a plurality of active devices (e.g., field effect transistors (FETs)) are formed in a semiconductor substrate structure and the devices interconnected with microwave transmission lines, also formed on the substrate structure, to form, for example, a plurality of interconnected amplifiers. One type of microwave transmission line is coplanar waveguide (CPW) transmission line.

As is also known in the art, for certain high power applications the bottom side of the CPW MMIC is metalized so that a heat sink can be attached as shown in FIG. 1. We have found that this added metalized surface, in conjunction with the topside metal used for the ground plane of the CPW, forms a two-conductor, parallel plate, system that can support waveguide modes that generate feedback around the amplifiers interconnected by the CPW transmission line resulting in unwanted amplifier oscillation. If the resonance frequency associated with this mode falls within the frequency of operation of the amplifier circuit then it may hinder the proper operation of the circuit. Unwanted oscillation associated with this type of moding was experimentally verified as shown in FIG. 2 with an unwanted oscillation at 9.187 GHz (i.e., an inherent resonance without an input signal) and was found to be a limiter for the proper operation of the circuit. In addition to the waveguide mode between the top and bottom metal surface of the MMIC, another type of moding we have found may occur if the MMIC is place in a flip-chip configuration (FIG. 1) on a printed circuit board (PCB). In this case the two-conductor system is formed by the top metal surface of the MMIC and the ground plane on the PCB. This mode also may disrupt the proper circuit operation in the same way described above.

In one embodiment, a monolithic microwave integrated circuit structure is provided: a semiconductor substrate structure; a plurality of active devices formed in a bottom surface portion of the substrate structure; and a microwave transmission line formed on the bottom surface of the substrate structure having an input section, an output section and a interconnecting section electrically connected between the input section and the output section, such interconnecting section electrically interconnecting the active devices. The semiconductor substrate structure has: a first peripheral region disposed on the top surface thereof over the input section; a inner region disposed on the top surface thereof over the interconnecting section; and a second peripheral region disposed on the top surface thereof over the output section. A heat sink is disposed over the top surface of the substrate structure. A metal layer is disposed on the top surface of the substrate structure under the heat sink. The metal layer has an outer periphery terminating at the outer periphery of the heat sink.

In one embodiment, the microwave transmission line is coplanar waveguide transmission line.

In one embodiment, the monolithic microwave integrated circuit structure includes: a printed circuit board having: electrically conductors therein; electrically conductive bumps on an upper surface of the printed circuit board, such bumps being in electrical contact with the transmission line; and electrically conductive vias passing into the printed circuit board between the electrical conductors in the printed circuit board and the conductive bumps.

In one embodiment, a monolithic microwave integrated circuit structure is provided, comprising: a semiconductor substrate structure; a plurality of active devices formed in a bottom surface portion of the substrate structure; a microwave transmission line formed on the bottom surface of the substrate structure having an input section, an output section and a interconnecting section electrically connected between the input section and the output section, such interconnecting section electrically interconnecting the active devices. The semiconductor substrate structure has: a first peripheral region disposed on the top surface thereof over the input section; a inner region disposed on the top surface thereof over the interconnecting section; and a second peripheral region disposed on the top surface thereof over the output section. A thermally conductive heat sink is disposed over a top surface portion of the substrate structure, such heat sink being disposed over the interconnecting section and having an outer periphery thereof terminating at the first peripheral region and the second peripheral region of the top surface of the substrate structure.

In one embodiment, a metal layer is disposed on the top surface of the substrate structure under the heat sink and wherein the metal layer has an outer periphery terminating at the outer periphery of the heat sink.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 3:
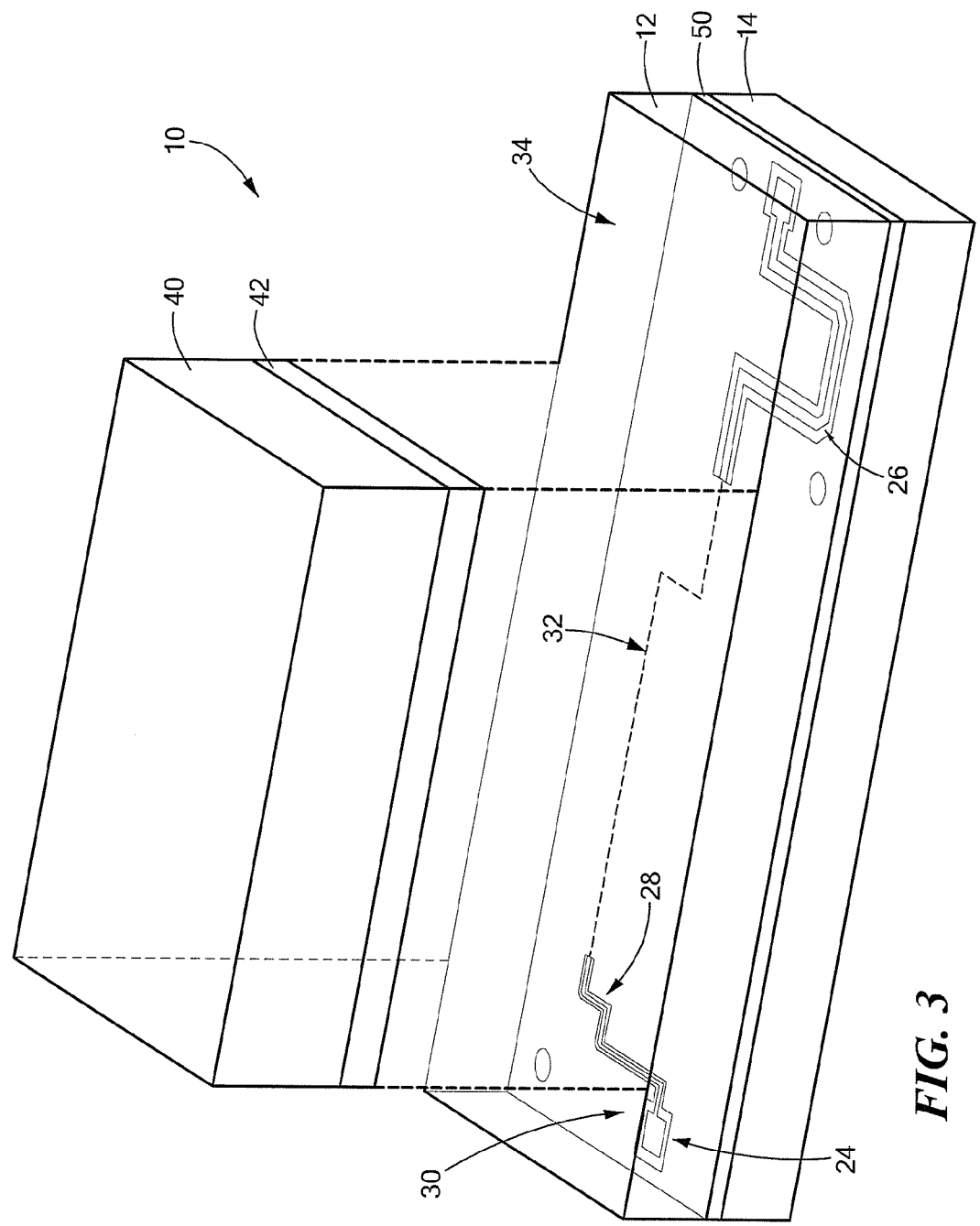
FIG. 3 is an exploded, diagrammatical sketch of a monolithic microwave integrated circuit (MMIC) structure according to the disclosure.
Figure 4:
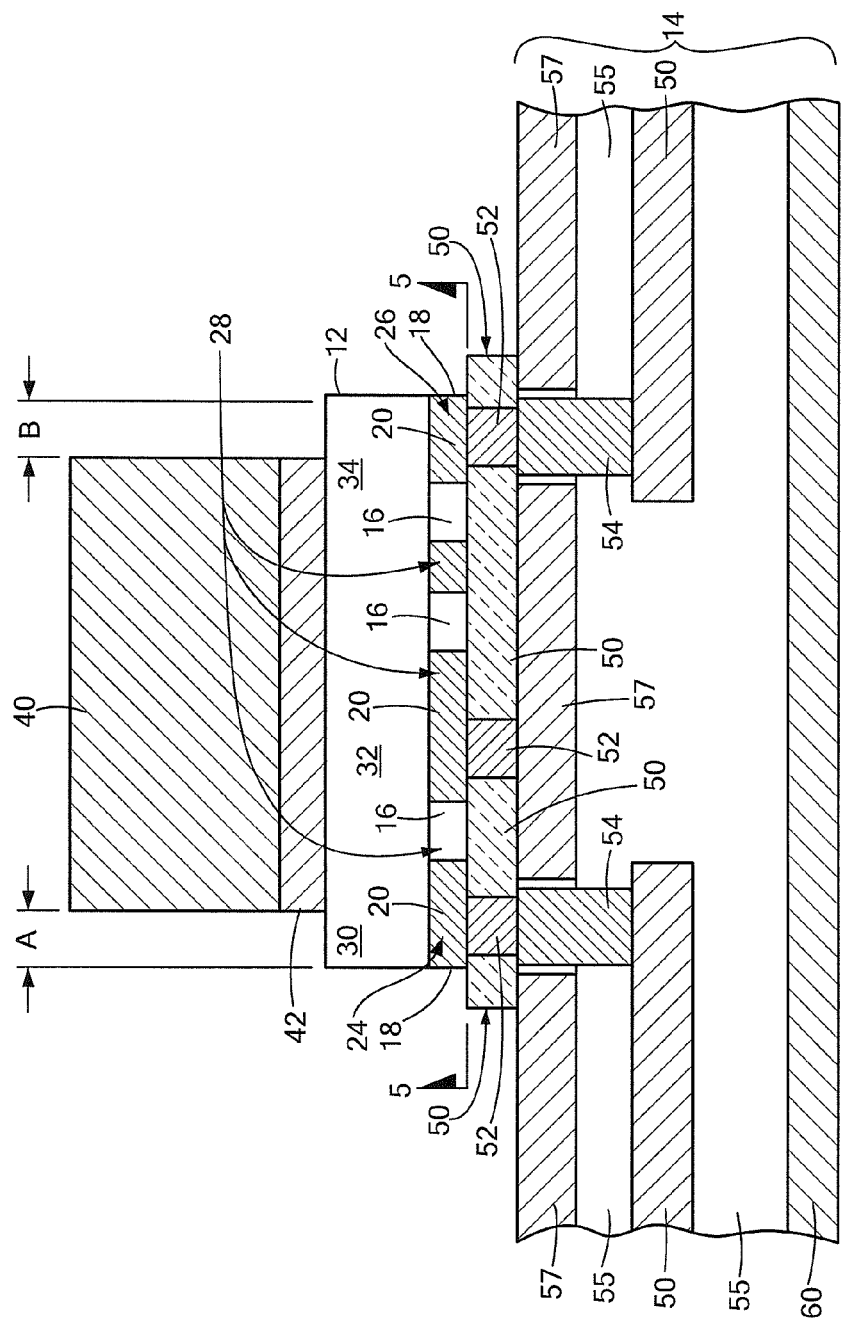
FIG. 4 is a cross sectional, diagrammatical sketch of a monolithic microwave integrated circuit (MMIC) structure of FIG. 3.
Figure 5:
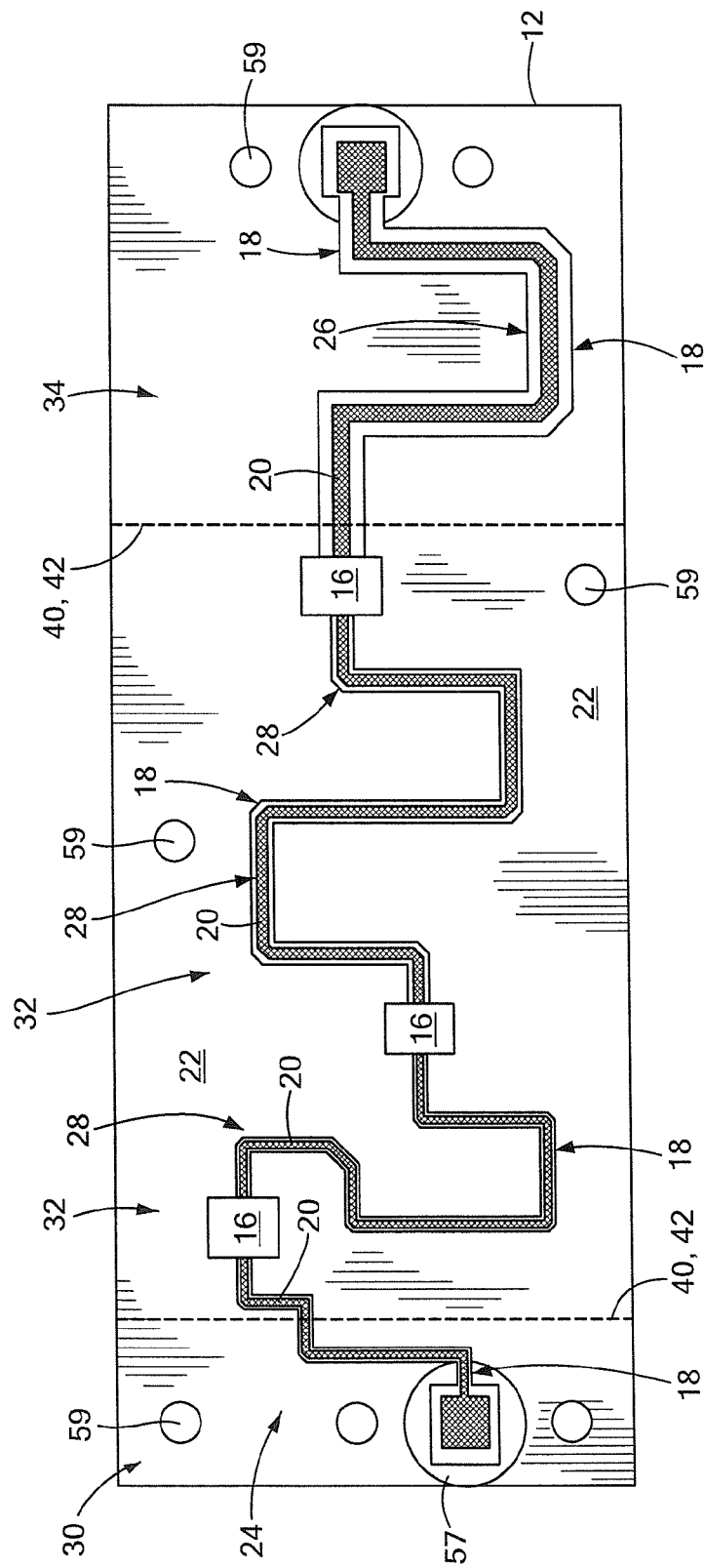
FIG. 5 is a plan view of a surface of the MMIC of FIG. 4 looking along line 5-5 of FIG. 4.

Referring now to FIGS. 3, 4 and 5, a monolithic microwave integrated circuit (MMIC) structure 10 is shown. The structure 10 includes an MMIC chip 12 mounted on the printed circuit board (PCB) 14 in flip-chip configuration. The MMIC structure 10 includes: a semiconductor substrate structure 12, here for example, GaN having a plurality of active devices (e.g., transistors) formed in a bottom surface portion of the substrate structure 12, here arranged as a plurality of, here, for example, three microwave amplifiers 16 (FIG. 5); and a microwave transmission line 18, here for example, a coplanar waveguide (CPW) microwave transmission line, formed on the bottom surface of the substrate structure 12. As is known, the CPW has strip conductors 20 separated from a coplanar ground plane conductor 22 by portions of the semiconductor substrate 12. The CPW has an input section 24, an output section 28 and a interconnecting section 26 electrically connected between the input section and the output section. The interconnecting section electrically interconnects the active devices, here electrically interconnects the three microwave amplifiers 16, as indicated in FIG. 5.

The semiconductor substrate structure 12 includes: a first peripheral region 30 disposed on the top surface thereof (prior to being flip-chip mounted to the PCB) over the input section 24; a inner region 32 disposed on the top surface thereof over the interconnecting section 28; and a second peripheral region 34 disposed on the top surface thereof over the output section 26.

The MMIC structure 10 includes a thermally conductive heat sink 40 disposed over a top surface portion of the substrate structure 10, such heat sink being disposed over the interconnecting section 26 and having an outer periphery thereof terminating at the first peripheral region 30 and the second peripheral region 34 of the top surface of the substrate structure 12. The MMIC structure 10 includes a thermally conducing, here metal layer 42 disposed on the top surface of the substrate structure 12 under the heat sink 40. The metal layer 42 has an outer periphery terminating at the outer periphery of the heat sink 40.

It is noted that neither the heat sink 40 nor the metal layer 42 cover (i.e., are not disposed over) the input section 24 or the output section 28 of the transmission line 18.

The MMIC structure 10 includes an under fill layer 50 of any suitable dielectric material having electrically conductive solder bumps 52 positioned as indicated to electrically connect the strip conductors 20 of the CPW transmissions line interconnecting the input and output sections 24, 28 of the CPW transmission line 18.

The PCB 14 has vias 54 (FIG. 4) passing from the upper surface thereof through the dielectric 55 of the PCB to electrical conductors 58 within the PCB 14, such vias 54 being aligned to the solder bumps 52, as indicated. The PCB has a ground plane conductor 60.

To solve the moding thru the under-fill material 50, ground bumps 59 in addition to the ground-signal-ground bumps 52 were added. These bumps connect the top metal of the MMIC to the top metal layer of the board. The additional bumps 59 connect the ground plane conductor 22 (FIG. 5) of the MMIC 12 to the top metal layer 57 of the PCB board. The bumps 59 are placed strategically so that a) the solder bumps 52 do not interface with circuit operation b) where the fields associated with the mode is strong and c) symmetry is avoided. The results clearly show that the mode within the under-fill at 16.8 GHz is suppressed. The mode within the substrate is unchanged as expected.

Figure 1:
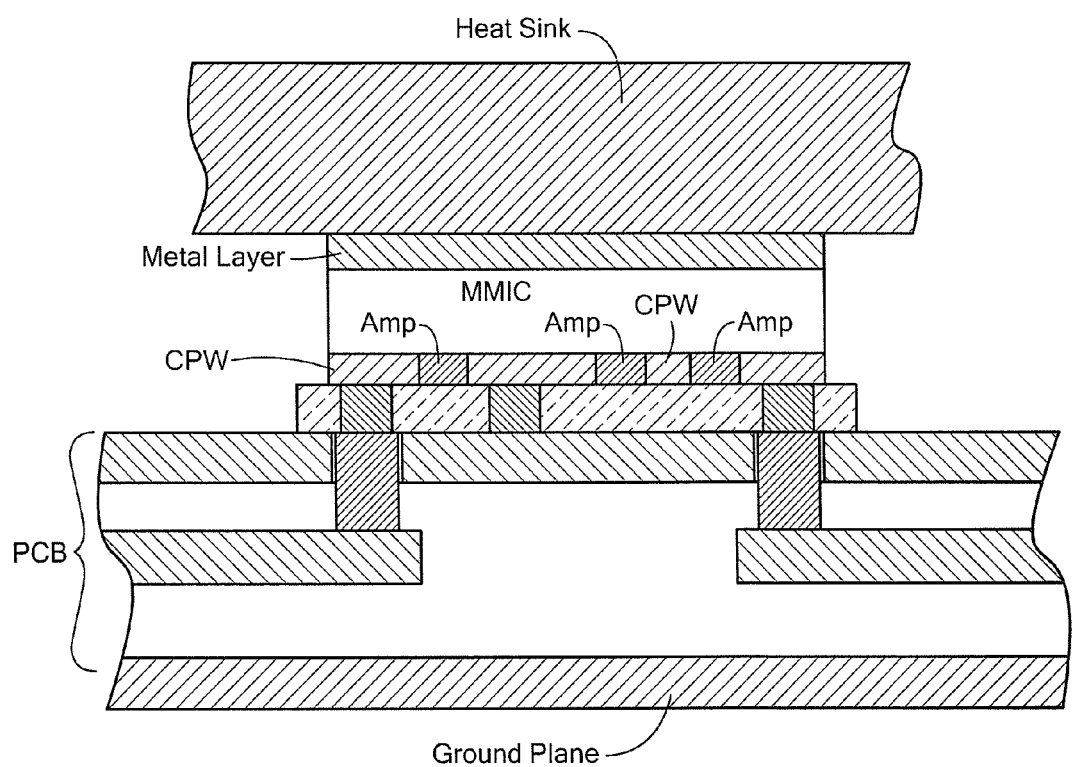
FIG. 1 is a cross sectional, diagrammatical sketch of a monolithic microwave integrated circuit (MMIC) structure according to the PRIOR ART.
Figure 2:
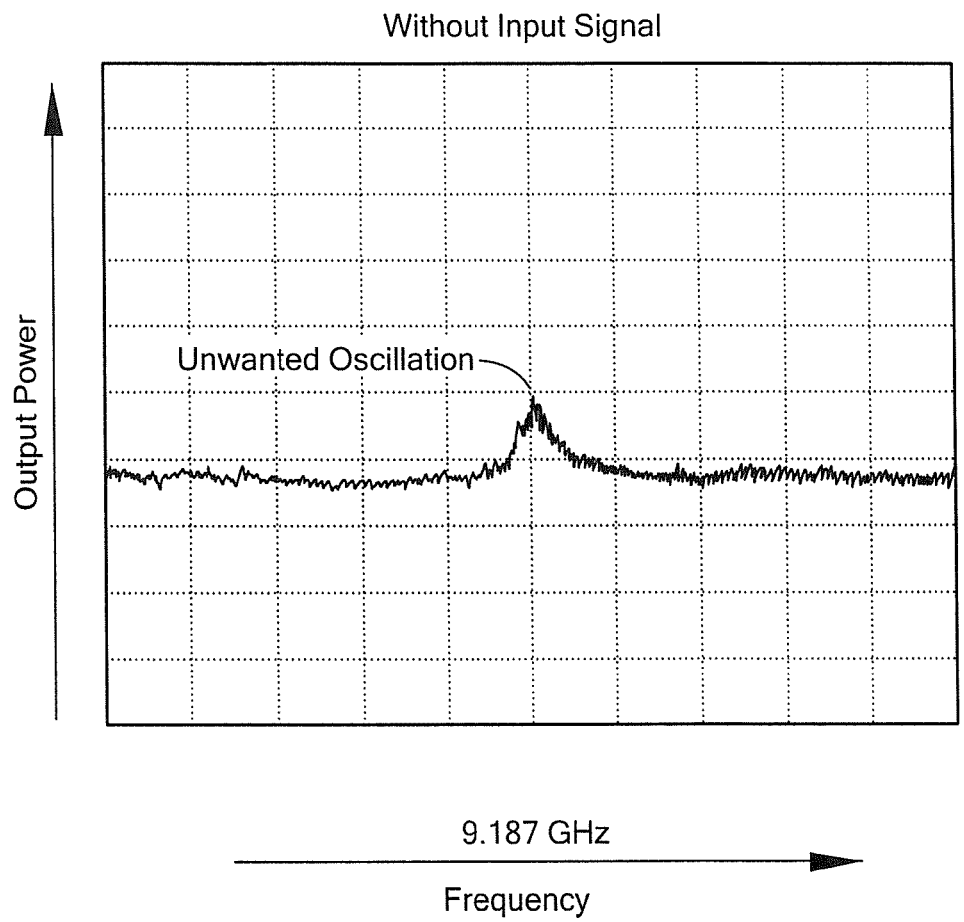
FIG. 2 is a curve showing the output power vs. frequency of a power amplifier MMIC without an input signal according to the PRIOR ART.
Figure 6:
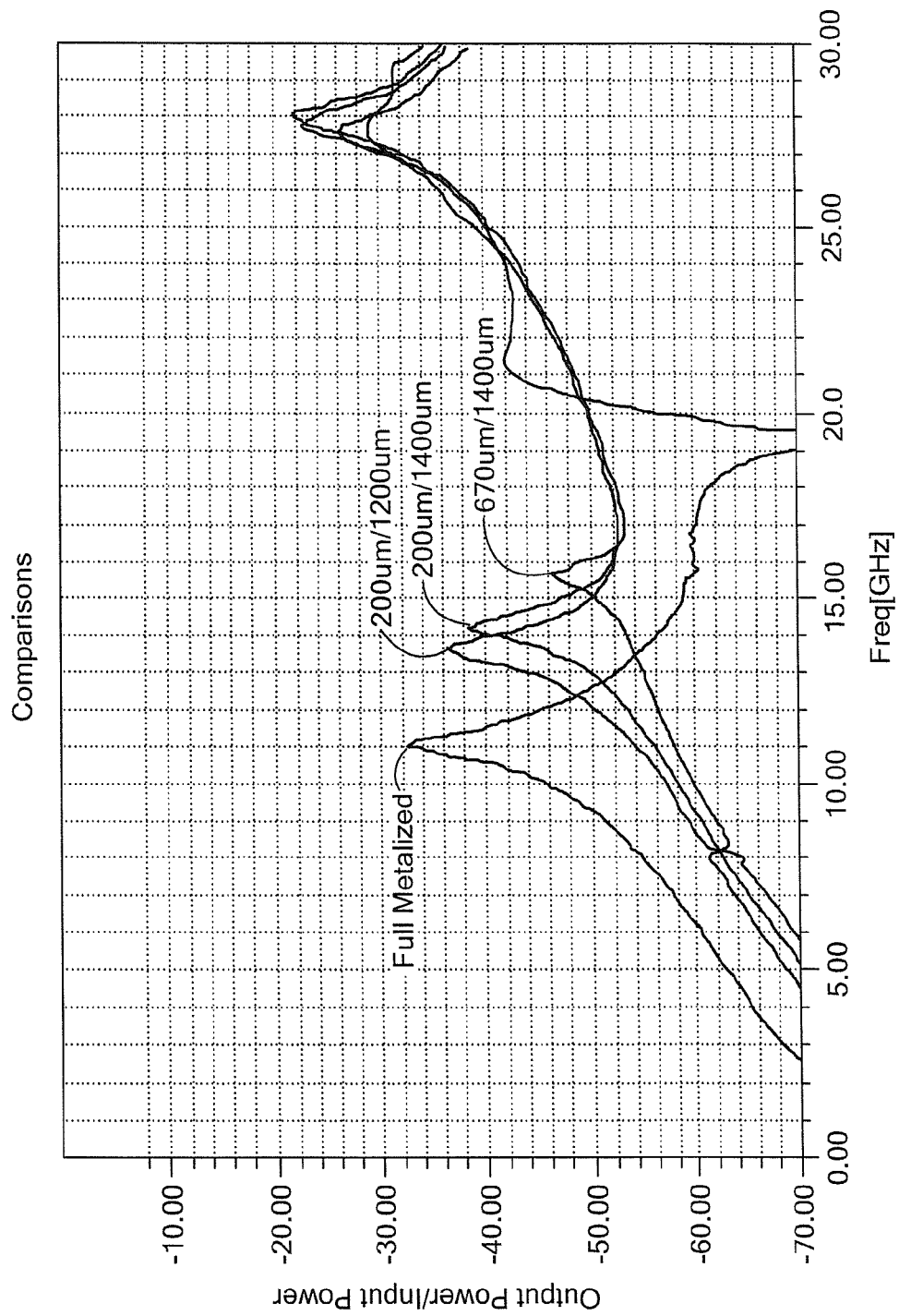
FIG. 6 are curves showing resonance modes within the structure of FIG. 4 for various dimensions' of a metal layer and the heat sink on an MMIC of the structures are of FIG. 4; one of the curves being for a metal layer shown in the PRIOR ART of FIG. 1

With the structure 10 described above in connection with FIGS. 3, 4 and 5, because neither the heat sink 40 nor the metal layer 42 overlay (i.e., are not disposed over) the input section 24 or the output section 28 of the transmission line 18, modes within the substrate were suppressed. It was observed that the field for this mode is strong in the input and output sections 24, 28 of the MMIC structure 10. This was verified by simulation experiments using HFSS® 3D full-wave simulator. FIG. 6 shows mode profile with different amount of back-side ground metal layer 42 being removed over the input and output sections 24, 28. The results show that the isolation improves as the ground plane metal 24 is moved away from the input/output input and output sections 24, 28; more particularly: The curve labeled "FULLY METALIZED" is for the PRIOR ART structure of FIG. 1 where the length "A" and the length "B" in FIG. 4 are both zero (with a fully metalized case); the curve labeled "200 μm/1200 μm" are where the length "A" and the length "B" in FIG. 4 are 200 μm and 1200 μm, respectively; the curve labeled "200 μm/1400 μm" are where the length "A" and the length "B" in FIG. 4 are 200 μm and 1400 μm; and the curve labeled "670 μm/1400 μm" are where the length "A" and the length "B" in FIG. 4 are 670 μm and 1400 μm, respectively. The results show a two-fold benefit: First, the reduction in coupling as the metal layer 42 and heat sink ground plane 40 is moves away from the input and output sections 24, 28; second, the reduction of the effective electrical length of the waveguide (the resonance frequency of the mode increases as a result). The combined effect is dramatic improvement of isolation within the frequency band of interest. The amount of recess is specific to a design and needs to be balanced between the isolation and heat-sinking requirement.

Detailed analysis of the structure 10 was conducted using a 3D full-wave EM solver. The frequency and the coupling via the waveguide modes were found to be strong functions of the following:

1. Physical dimension (length, width) of the MMIC. The thickness of the semiconductor substrate 12 and the under-fill 50 affects the modes associated with each.
2. The relevant material properties ($\in_r$, σ) of the MMIC substrate 12 and the under-fill 50 material.
3. The dimension (length, width and gap) of the input and output sections 24, 26 CPW on the MMIC.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A monolithic microwave integrated circuit structure comprising:
   a semiconductor chip comprising:
      a plurality of active devices and a microwave transmission line having an input section, an output section and a interconnecting section electrically interconnecting the active devices on one surface of the chip; and
      a metal layer on an opposite surface of the chip overlaying the interconnection section and absent from overlaying at least one of the input section and the output section.

2. The monolithic microwave integrated circuit structure recited in claim 1 wherein the microwave transmission line is coplanar waveguide transmission line.

3. A monolithic microwave integrated circuit structure, comprising:
   a semiconductor chip;
   a plurality of active devices formed in a bottom surface portion of the chip;
   a microwave transmission line formed on the bottom surface of the chip having an input section, an output section and a interconnecting section electrically connected between the input section and the output section, such interconnecting section electrically interconnecting the active devices;

wherein the semiconductor chip has: a first peripheral region disposed on the top surface thereof over the input section; a inner region disposed on the top surface thereof over the interconnecting section; and a second peripheral region disposed on the top surface thereof over the output section;

a heat sink disposed over the top surface of the chip;

a metal layer disposed on the top surface of the chip under the heat sink; and wherein the metal layer has an outer periphery terminating at the outer periphery of the heat sink.

4. The monolithic microwave integrated circuit structure recited in claim 3 wherein the microwave transmission line is coplanar waveguide transmission line.

5. The monolithic microwave integrated circuit structure recited in claim 4 including:

a printed circuit board having:

electrically conductors therein;

electrically conductive bumps on an upper surface of the printed circuit board, such bumps being in electrical contact with the transmission line;

electrically conductive vias passing into the printed circuit board between the electrical conductors in the printed circuit board and the conductive bumps.

6. A monolithic microwave integrated circuit structure, comprising:

a semiconductor chip;

a plurality of active devices formed in a bottom surface portion of the chip;

a microwave transmission line formed on the bottom surface of the chip structure having an input section, an output section and a interconnecting section electrically connected between the input section and the output section, such interconnecting section electrically interconnecting the active devices;

wherein the semiconductor chip has: a first peripheral region disposed on the top surface thereof over the input section; a inner region disposed on the top surface thereof over the interconnecting section; and a second peripheral region disposed on the top surface thereof over the output section; and a thermally conductive heat sink disposed over a top surface portion of the chip, such heat sink being disposed over the interconnecting section and having an outer periphery thereof terminating at the first peripheral region and the second peripheral region of the top surface of the chip.

7. The monolithic microwave integrated circuit structure recited in claim 6 wherein the microwave transmission line is coplanar waveguide transmission line.

8. The monolithic microwave integrated circuit structure recited in claim 6 including a metal layer disposed on the top surface of the chip under the heat sink and wherein the metal layer has an outer periphery terminating at the outer periphery of the heat sink.

9. The monolithic microwave integrated circuit structure recited in claim 7 including a metal layer disposed on the top surface of the chip under the heat sink and wherein the metal layer has an outer periphery terminating at the outer periphery of the heat sink.

10. The monolithic microwave integrated circuit structure recited in claim 6 including:

a printed circuit board having:

electrically conductors therein;

electrically conductive bumps on an upper surface of the printed circuit board, such bumps being in electrical contact with the transmission line;

electrically conductive vias passing into the printed circuit board between the electrical conductors in the printed circuit board and the conductive bumps.

11. The monolithic microwave integrated circuit structure recited in claim 10 including a metal layer disposed on the top surface of the chip under the heat sink and wherein the metal layer has an outer periphery terminating at the outer periphery of the heat sink.

12. The monolithic microwave integrated circuit structure recited in claim 7 including:

a printed circuit board having:

electrically conductors therein;

electrically conductive bumps on an upper surface of the printed circuit board, such bumps being in electrical contact with the transmission line;

electrically conductive vias passing into the printed circuit board between the electrical conductors in the printed circuit board and the conductive bumps; and, a metal layer disposed on the top surface of the chip under the heat sink and wherein the metal layer has an outer periphery terminating at the outer periphery of the heat sink.

* * * * *